(12) United States Patent
Hsu

(10) Patent No.: US 10,090,042 B2
(45) Date of Patent: Oct. 2, 2018

(54) MEMORY WITH KEEPER CIRCUIT

(71) Applicant: Taiwan Semiconductor Manufacturing Co., Ltd., Hsinchu (TW)

(72) Inventor: Kuoyuan Hsu, San Jose, CA (US)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 15/793,383

(22) Filed: Oct. 25, 2017

(65) Prior Publication Data
US 2018/0047442 A1 Feb. 15, 2018

Related U.S. Application Data

(63) Continuation of application No. 15/081,248, filed on Mar. 25, 2016, now Pat. No. 9,818,474.

(51) Int. Cl.
| | | |
|---|---|---|
| G11C 16/28 | (2006.01) | |
| G11C 11/419 | (2006.01) | |
| G05F 3/26 | (2006.01) | |
| G11C 11/412 | (2006.01) | |
| G11C 7/12 | (2006.01) | |
| G11C 7/06 | (2006.01) | |
| G11C 16/04 | (2006.01) | |
| G11C 11/56 | (2006.01) | |
| G11C 16/26 | (2006.01) | |

(52) U.S. Cl.
CPC ............ *G11C 11/419* (2013.01); *G05F 3/262* (2013.01); *G11C 7/12* (2013.01); *G11C 11/412* (2013.01); *G11C 7/062* (2013.01); *G11C 11/5642* (2013.01); *G11C 16/0483* (2013.01); *G11C 16/26* (2013.01); *G11C 16/28* (2013.01)

(58) Field of Classification Search
CPC ..... G11C 16/28; G11C 16/26; G11C 11/5642; G11C 7/062; G11C 16/0483
USPC ............ 365/189.05, 230.08, 185.21, 230.05
See application file for complete search history.

(56) References Cited

U.S. PATENT DOCUMENTS

| | | |
|---|---|---|
| 8,605,523 B2 | 12/2013 | Tao et al. |
| 8,630,132 B2 | 1/2014 | Cheng et al. |
| 8,760,948 B2 | 6/2014 | Tao et al. |
| 8,908,421 B2 | 12/2014 | Liaw |
| 8,929,160 B2 | 1/2015 | Katoch et al. |
| 8,964,492 B2 | 2/2015 | Hsu et al. |
| 8,982,643 B2 | 3/2015 | Lum |
| 9,117,510 B2 | 8/2015 | Yang et al. |
| 9,208,858 B1 | 12/2015 | Lin et al. |
| 9,218,872 B1 | 12/2015 | Liaw |

(Continued)

*Primary Examiner* — Jason Lappas
(74) *Attorney, Agent, or Firm* — Sterne, Kessler, Goldstein & Fox P.L.L.C.

(57) ABSTRACT

A memory device with a keeper circuit is disclosed herein. The memory device (i) improves current tracking between the device's memory cells and the keeper circuit, (ii) improves Vccmin for memory operations, and (iii) has an efficient circuit layout. The memory device includes a memory array with a plurality of bitlines coupled to the memory cells. The keeper circuit includes a plurality of switches and a current mirror circuit. The plurality of switches is respectively coupled to the plurality of bitlines. The current mirror circuit mirrors a bias current to a plurality of current mirror transistors respectively coupled to the plurality of switches.

21 Claims, 4 Drawing Sheets

(56) References Cited

U.S. PATENT DOCUMENTS

| | | |
|---|---|---|
| 2010/0259999 A1* | 10/2010 | Lee .................. G11C 11/419 |
| | | 365/189.11 |
| 2014/0153345 A1 | 6/2014 | Kim et al. |
| 2014/0233330 A1 | 8/2014 | Ko et al. |
| 2015/0348598 A1 | 12/2015 | Wang et al. |
| 2015/0371702 A1 | 12/2015 | Wu et al. |
| 2015/0380077 A1 | 12/2015 | Wu et al. |
| 2015/0380078 A1 | 12/2015 | Liaw |
| 2017/0278564 A1 | 9/2017 | Hsu |

* cited by examiner

MEMORY WITH KEEPER CIRCUIT

CROSS-REFERENCE TO RELATED APPLICATIONS

The present application is a continuation of U.S. patent application Ser. No. 15/081,248, filed Mar. 25, 2016 now U.S. Pat. No. 9,818,474, which is incorporated herein by reference in its entirety.

BACKGROUND

The present disclosure generally relates to static random access memory (SRAM).

SRAM is a type of semiconductor memory typically used in computing applications requiring high-speed data access. For example, cache memory applications use SRAMs to store frequently-accessed data—e.g., data accessed by central processing units.

The SRAM's cell structure and architecture enable the high-speed data access. The SRAM cell includes a bi-stable flip-flop structure and transistors that pass voltages from bitlines to the flip-flop structure. A typical SRAM architecture includes one or more arrays of memory cells and support circuitry. The memory cells of each SRAM array are arranged in rows and columns. Access to memory cells in a row is controlled by a "wordline." Data is transferred into (write operation) and out of (read operation) memory cells on "bitlines." There is at least one bitline for each column of memory cells. The support circuitry includes address and driver circuits to access each of the SRAM cells—via the wordlines and bitlines—for various SRAM operations.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
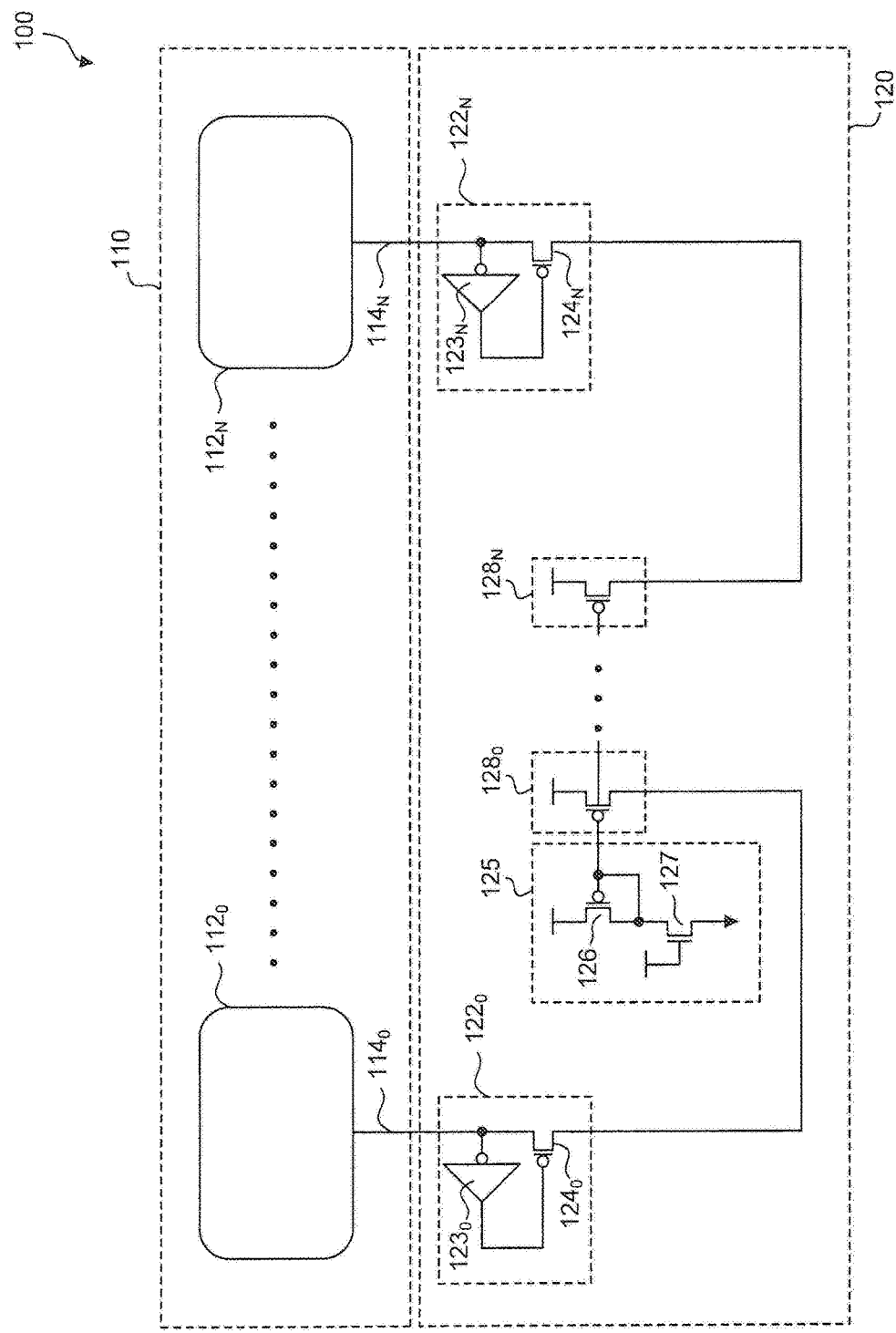
FIG. 1 depicts a memory device with a keeper circuit, according to embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

The following disclosure describes aspects of an SRAM. For ease of explanation, certain SRAM circuit elements and control logic are disclosed to facilitate in the description of the different embodiments. A person of ordinary skill in the art will understand that SRAMs also include other circuit elements and control logic. These other circuit elements and control logic are within the spirit and scope of this disclosure.

FIG. 1 depicts a memory device with a keeper circuit, according to embodiments of the present disclosure. Memory device 100 includes a memory array 110 and a keeper circuit 120. For explanation purposes, memory array 110 is represented by memory cells $112_0$-$112_N$. Memory cells $112_0$-$112_N$ are connected to bitlines $114_0$-$114_N$, respectively. In FIG. 1, only one row of memory cells is shown for memory array 110 for simplicity and explanation purposes. Also, memory array 110 has 'N' columns. A person of ordinary skill in the art will recognize that memory cells $112_0$-$112_N$ in memory array 110 are arranged in rows and columns, and that memory array 110 can have more than one row and more or less than 'N' columns.

Keeper circuit 120 maintains a precharge voltage—e.g., a voltage at or near a logic high voltage—on bitlines $114_0$-$114_N$. Specifically, keeper circuit 120 is designed to assist in "keeping" bitlines $114_0$-$114_N$ charged to a voltage at or near a logic high voltage—e.g., at or near a power supply voltage of 1.2 V, 1.8 V, 2.4 V, 3.3 V, or 5 V—if the bitlines are supposed to be charged to the logic high voltage. Keeper circuit 120 is strong enough to resist leakage and noise that would otherwise cause the bitlines to errantly discharge. Conversely, if bitlines $114_0$-$114_N$ are set to a voltage at or near a logic low voltage—e.g., at or near ground or 0V—keeper circuit 120 is designed to be weak enough to allow bitlines $114_0$-$114_N$ to discharge when they are supposed to discharge to the logic low voltage. Keeper circuit 120 is coupled to a plurality of bitlines in memory array 110. In an embodiment, keeper circuit 120 can be coupled to 2, 4, 8, 16, 32, or more bitlines. Also, in an embodiment, keeper circuit 120 can be coupled to 1, 3, 5, 7, 9, or more bitlines.

Keeper circuit 120 includes switches $122_0$-$122_N$, a bias current generator 125, and current mirror transistors $128_0$-$128_N$. In an embodiment, switches $122_0$-$122_N$ are respectively coupled to bitlines $114_0$-$114_N$ in memory array 110. In an embodiment, current mirror transistors $128_0$-$128_N$ are respectively coupled to switches $122_0$-$122_N$.

Each of switches $122_0$-$122_N$ includes an inverter 123 and a pass device 124. In an embodiment, pass device 124 is a p-channel metal-oxide-semiconductor field-effect transistor ("PMOS transistor"). When bitlines $114_0$-$114_N$ are set to a logic low voltage, inverters $123_0$-$123_N$ output a logic high voltage. The inverters' outputs are connected to control terminals of pass devices $124_0$-$124_N$—e.g., gate terminals of PMOS transistors $124_0$-$124_N$. With the logic high voltage applied to their control terminals, pass devices $124_0$-$124_N$ do not electrically connect current mirror transistors $128_0$-$128_N$ to bitlines $114_0$-$114_N$, respectively.

When bitlines $114_0$-$114_N$ are precharged to a logic high voltage, switches $122_0$-$122_N$ electrically connect current mirror transistors $128_0$-$128_N$ to bitlines $114_0$-$114_N$, respectively. Inverters $123_0$-$123_N$ output a logic low voltage to control terminals of pass devices $124_0$-$124_N$—e.g., gate terminals of PMOS transistors $124_0$-$124_N$. As a result, pass devices $124_0$-$124_N$ pass current from current mirror transistors $128_0$-$128_N$ to bitlines $114_0$-$114_N$, respectively. The current from current mirror transistors $128_0$-$128_N$ to bitlines $114_0$-$114_N$, respectively, maintains—or "keeps"—bitlines $114_0$-$114_N$ charged to a voltage at or near the logic high voltage. The current from current mirror transistors $128_0$-$128_N$ is also referred to as a "keeper current."

The keeper current is based on a current generated by bias current generator 125. Bias current generator 125 includes an n-channel MOSFET 127 ("NMOS transistor 127") and a load device 126. In an embodiment, NMOS transistor 127 is a long-channel transistor. The gate length of long-channel NMOS transistor 127 can be between 20 and 30 nm, according to an embodiment. Long-channel transistors are devices with width and length dimensions long enough such that edge effects from the transistor's channel can be neglected. Long-channel devices are well known in the art. In an embodiment, load device 126 is an active device such as a diode-connected PMOS transistor. Diode-connected PMOS transistor 126—in which the gate is connected to the drain of the transistor—is shown in FIG. 1.

A power supply voltage—e.g., 1.2 V, 1.8 V, 2.4 V, 3.3 V, or 5 V—is connected to the source terminal of PMOS transistor 126 and to the gate terminal of long-channel NMOS transistor 127, according to an embodiment. Based on these applied voltages and the physical dimensions of PMOS transistor 126 and NMOS transistor 127—e.g., gate width and gate length of the transistors—a current is generated by bias current generator 125. The current generated by bias current generator 125 is also referred to as a "bias current."

The bias current is mirrored by each of transistors $128_0$-$128_N$ by a ratioed value, according to an embodiment. In an embodiment, the ratio depends on the gate dimensions of PMOS transistor 126 ("PMOS_126") and the gate dimensions of current mirror transistor 128 ("CMT_128"):Ratioed value=$[(W/L)_{PMOS\_126}]$:$[(W/L)_{CMT\_128}]$. The ratio can be 1:1, 2:1, 4:1, 8:1, etc. Specifically, in an embodiment, the gate width of current mirror transistor 128 is sized equal to or smaller than the gate width of PMOS transistor 126 to achieve a desired ratio. For example, if bias current generator 125 generates a bias current of 80 µA and the desired keeper current is 10 µA, then the gate width of current mirror transistor 128 can be sized ⅛ of the gate width of PMOS transistor 126 to achieve the desired keeper current.

An advantage of the above keeper circuit embodiment is that the gate length for long-channel NMOS transistor 127 does not need to be a significant size—e.g., 90 nm—such that "keep-out" areas in layout are required. A person of ordinary skill in the art will recognize that layout constraints are present when designing transistors with gate structures longer than a certain length. These layout constraints are typically based on a technology node—or process technology—used to fabricate the transistors. These constraints include keep-out areas in which other device structures cannot be placed within a predetermined distance from the long-channel device. The long-channel device and its associated keep-out areas can consume a significant amount of area. In the above keeper circuit embodiment, a desired keeper current can be passed by current mirror transistors $128_0$-$128_N$ to bitlines $114_0$-$114_N$ via respective switches $122_0$-$122_N$ by (i) reducing the gate length of long-channel NMOS transistor 127 to avoid keep-out areas in layout and (ii) sizing PMOS transistor 126 and current mirror transistors $128_0$-$128_N$ appropriately to achieve the desired keeper circuit.

Another advantage of the above keeper circuit embodiment is size. As described above, one bias current generator 125 is shared by multiple current mirror transistors $128_0$-$128_N$ and switches $122_0$-$122_N$ to provide the keeper current to multiple bitlines $114_0$-$114_N$. This is in contrast to other keeper circuit designs that require a bias current generator for every bitline; thus, the layout of these designs require a long-channel device for every bitline. A long-channel device for every bitline consumes a significant amount of area. Embodiments of the present disclosure consume less area by sharing one long-channel device for multiple bitlines.

Other advantages of the above keeper circuit embodiment include (i) improved current tracking between the SRAM cell and keeper circuit 120 and (ii) improved Vccmin for SRAM operations. These advantages are described in more detail below with respect to FIGS. 2 and 3.

Figure 2:
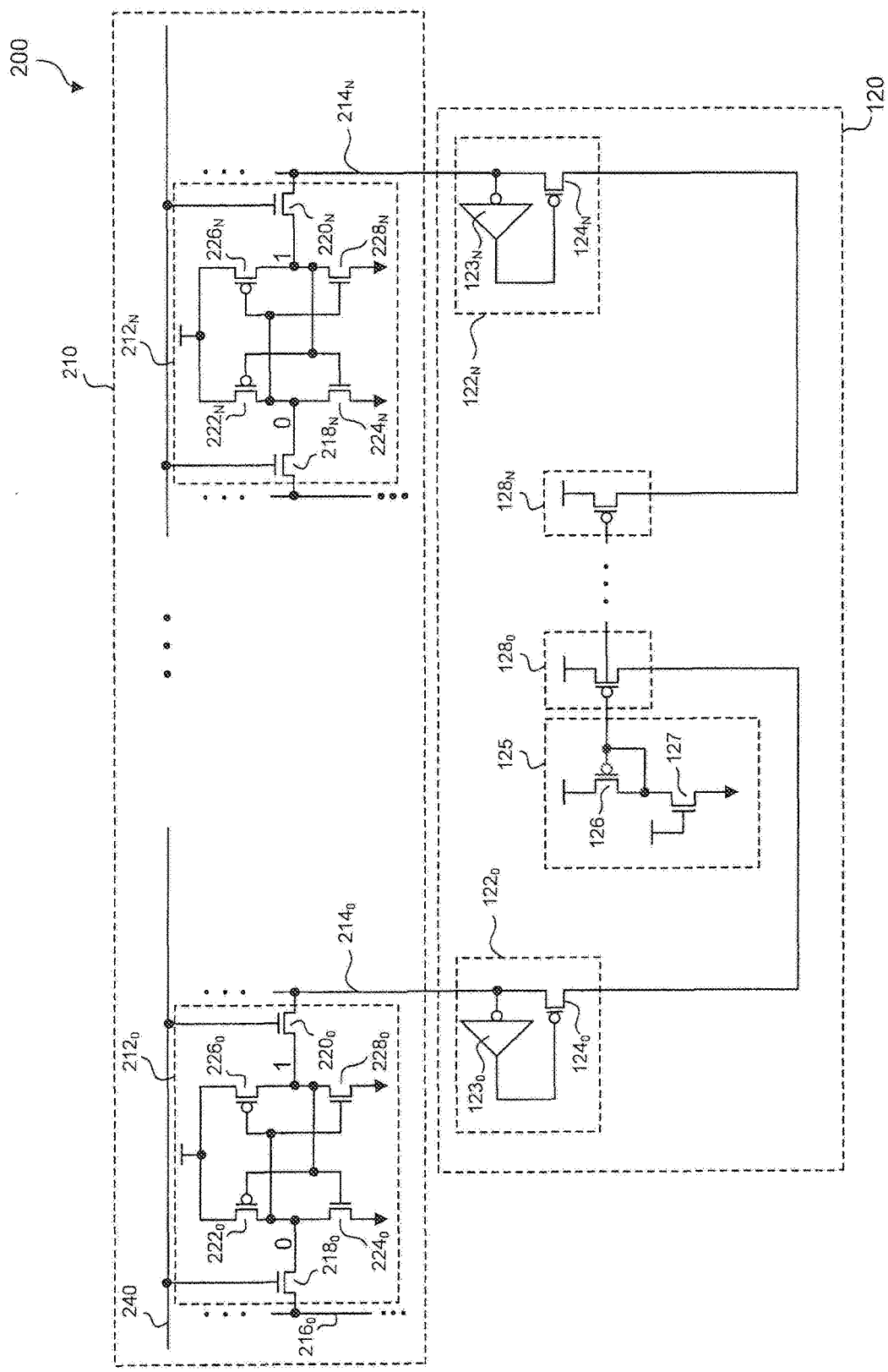
FIG. 2 depicts an SRAM device with a keeper circuit, according to embodiments of the present disclosure.

FIG. 2 depicts an SRAM device 200 with keeper circuit 120, according to embodiments of the present disclosure. SRAM device 200 includes a memory array 210 and keeper circuit 120. Keeper circuit 120 operates in the same manner as described above with respect to FIG. 1.

In FIG. 2, only one row of SRAM memory cells $212_0$-$212_N$ is shown for memory array 210 for simplicity and explanation purposes. Also, memory array 210 has 'N' columns. As would be understood by a person of ordinary skill in the art, SRAM cells $212_0$-$212_N$ in memory array 210 are arranged in rows and columns, and memory array 210 can have more than one row and more or less than 'N' columns.

In an embodiment, each of SRAM cells $212_0$-$212_N$ has a "6T" circuit topology. Each SRAM cell 212 includes a bi-stable flip-flop structure—made up of transistors 222, 224, 226, and 228—and pass transistors 218 and 220 (also referred to as "readout port 218" and "readout port 220," respectively). Pass transistors 218 and 220 are controlled by a voltage applied to a wordline 240; this voltage is provided by a wordline driver, which is not shown in FIG. 2 for simplicity. Pass transistor 218 and pass transistor 220 electrically connect the SRAM's bi-stable flip-flop structure to bitline BL 216 and to bitline BLB 214, respectively (also referred to as "bitline 216" and "bitline 214"). The notation "BL" refers to a bitline, and the notation "BLB" refers to the complement of "BL"; the bitline pair BL/BLB concept is well known in the art. A person of ordinary skill in the art will recognize that other SRAM circuit topologies—e.g., "8T," "10T," "12T," and "14T" circuit topologies—can be implemented with embodiments of the present disclosure.

In an embodiment, keeper circuit 120 maintains a precharge voltage—e.g., a voltage at or near a logic high voltage—on bitlines $214_0$-$214_N$. For example, if bitlines $214_0$-$214_N$ are precharged to a voltage at or near the logic high voltage, keeper circuit 120 passes a keeper current—e.g., 10 µA—to the bitlines to maintain the voltage.

Keeper circuit 120 compensates for a leakage current present in SRAM cell 212. For example, with a precharged voltage at or near a logic high voltage on bitline 214, a "leaky" path to ground exists through pass transistor 220 and transistor 228 in the SRAM's bi-stable flip-flop structure. Leakage current from this leaky path can discharge the precharged voltage on bitline 214. The keeper current from keeper circuit 120 is strong enough to compensate for this leakage current—e.g., the keeper current is greater than the leakage current—and maintains the voltage on bitline 214. Conversely, the keeper current is also small enough that a selected SRAM cell 212 can discharge bitline 214 when the bitline is supposed to discharge to a voltage at or near a logic low voltage. For example, the keeper current can be greater than the leakage current but less than a predetermined current such that the selected SRAM cell 212 can discharge bitline 214.

Keeper circuit 120 in SRAM device 200 has many advantages. In addition to the long-channel NMOS transistor 127's gate length advantage and the one bias current generator 125 for multiple bitlines advantage described above with respect to FIG. 1, keeper circuit 120 in SRAM device 200 also provides (i) improved current tracking between the SRAM cell and keeper circuit 120 and (ii) improved Vccmin for SRAM operations.

Because long-channel NMOS transistor 127 and pass device 220 in SRAM cell 212 are the same device type, an improvement in current tracking between SRAM cell 212 and keeper circuit 120 can be achieved. As would be understood by a person of ordinary skill in the art, process variations—e.g., variations in the lengths, widths, and oxide thicknesses of transistors—can result in different types of transistors having different device characteristics. The effects of the different device characteristics on a circuit can be mitigated if the transistors are the same type because a variation in a particular type of device is likely to occur in other devices with the same device type.

For example, if a keeper circuit's bias current generator implements a long-channel PMOS transistor—rather than a long-channel NMOS transistor like FIGS. 1 and 2—to generate a bias current, then a mismatch in performance can occur between the keeper circuit and pass devices in the SRAM cell. Pass devices in the SRAM cell are NMOS transistors—e.g., pass devices 218 and 220 in SRAM cell 212 of FIG. 2. And, due to process variations, the long-channel PMOS transistor can have "strong" device characteristics (e.g., gate width is fabricated wider than a target width and/or gate length is fabricated shorter than a target length), whereas the NMOS pass transistors can have "weak" device characteristics (e.g., gate width is fabricated shorter than a target width and/or gate length is fabricated longer than a target length). In this mismatch scenario, the keeper circuit can generate a bias current—which is mirrored onto the bitlines as a keeper current—that is too strong for the bitline to discharge when it is supposed to discharge to a voltage at or near a logic low voltage such as, for example, ground or 0 V. This inability to discharge the bitline to the voltage at or near the logic low voltage is further exacerbated by the weak NMOS pass transistors, which can provide a high resistance path to ground via transistors in the SRAM's bi-stable flip-flop structure—e.g., transistor 228 in SRAM cell 212 of FIG. 2.

Conversely, due to process variations, the long-channel PMOS transistor can have "weak" device characteristics, whereas the NMOS pass transistors can have "strong" device characteristics. In this mismatch scenario, the keeper circuit can generate a bias current—which is mirrored onto the bitlines as a keeper current—that is too weak to maintain a logic high voltage on the bitline when it is supposed to be at or near a logic high voltage—e.g., a voltage at or near a power supply voltage of 1.2 V, 1.8 V, 2.4 V, 3.3 V, or 5 V. This inability to maintain the voltage on the bitline is further exacerbated by the strong NMOS pass transistors, which can provide a low resistance path to ground via transistors in the SRAM's bi-stable flip-flop structure—e.g., transistor 228 in SRAM cell 212 of FIG. 2.

The effects of the above mismatches are addressed by the keeper circuit embodiments of the present disclosure. Specifically, bias current generator 125 in keeper circuit 120 of FIG. 2 includes long-channel NMOS transistor 127 to generate a bias current. As discussed above, the gate length of long-channel NMOS transistor 127 does not need to be significant in size. As a result, long-channel NMOS transistor 127 can be sized closer in gate width and gate length dimensions as other NMOS transistors—e.g., pass devices 218 and 220 in SRAM cell 212 of FIG. 2. Pass devices 218 and 220 in SRAM cell 212 are also n-channel MOS transistors. Due to long-channel NMOS transistor 127, pass device 218, and pass device 220 being the same type of MOS transistor, process variations among these devices are typically similar for these devices. The resulting device characteristics of the transistors—e.g., electrical characteristics—are typically similar as well.

For example, a weak long-channel NMOS transistor 127 will typically have similar device characteristics as a weak NMOS pass transistor 220. With the weak device characteristics of these transistors, the keeper circuit generates a weak bias current, which is mirrored onto the bitlines as a keeper current. At the same time, the weak NMOS pass transistor 220 provides a high resistance path to ground via transistors in the SRAM's bi-stable flip-flop structure—e.g., transistor 228 in SRAM cell 212 of FIG. 2. Though the keeper circuit is "weak," the NMOS pass transistor's resistance is high such that the leakage current from the SRAM cell does not discharge the bitline when the bitline is supposed to be at a voltage at or near a logic high voltage.

Conversely, a strong long-channel NMOS transistor 127 will typically have similar device characteristics as a strong NMOS pass transistor 220. With the strong device characteristics of these transistors, the keeper circuit generates a strong bias current, which is mirrored onto the bitlines as a keeper current. At the same time, the strong NMOS pass transistor 220 provides a low resistance path to ground via transistors in the SRAM's bi-stable flip-flop structure—e.g., transistor 228 in SRAM cell 212 of FIG. 2. Though the keeper circuit is "strong," the NMOS pass transistor's resistance is low such that the leakage current from the SRAM cell discharges the bitline when the bitline is supposed to be at a voltage at or near a logic low voltage.

By using the same type of transistor—i.e., NMOS transistor—for the long-channel device in the current bias generator and the pass devices in the SRAM cell, the device characteristics of these transistors can track one another over process variations. Also, as would be understood by a person of ordinary skill in the art, the device characteristics of the transistors—e.g., electrical characteristics—also track one another across varying temperatures and supply voltages.

With the above device tracking characteristics of the keeper circuit embodiments, a lower Vccmin can be achieved for SRAM operations. As would be understood by a person of ordinary skill in the art, Vccmin refers to the minimum power supply voltage needed for an SRAM device to perform read and write operations. At high power supply Vcc voltages, SRAM cell operating margins are large thus leading to reliable read and write operations. However, at low power supply Vcc voltages, SRAM cell noise margins decrease. This decrease in noise margins—coupled with process variations—can significantly limit the minimum power supply Vcc voltage (or Vccmin) at which the SRAM cell can operate.

Keeper circuit embodiments of the present disclosure can mitigate the effects of process variations on Vccmin. For example, as discussed above, long-channel NMOS transistor 127, pass device 218, and pass device 220 of FIG. 2 typically have similar device characteristics across process variations because they are the same device type—i.e., NMOS transistors. For example, a strong long-channel NMOS transistor 127 typically has similar device characteristics as a strong NMOS pass transistor 220. With the strong device characteristics of these transistors, the keeper circuit generates a strong bias current, which is mirrored onto the bitlines as a keeper current.

At the same time, the strong NMOS pass transistor 220 provides a low resistance path to ground via transistors in the SRAM's bi-stable flip-flop structure—e.g., transistor 228 in SRAM cell 212 of FIG. 2. Though the keeper circuit is "strong," the NMOS pass transistor's resistance is low such that the leakage current from the SRAM cell discharges the bitline when the bitline is supposed to be at a logic low voltage. As a result, for a sensing operation on the bitline, the SRAM cell's Vccmin is minimized because the bitline voltage is at or near the intended logic low voltage due to the strong long-channel NMOS transistor 127 and the strong NMOS pass transistor 220 tracking one another—e.g., tracking each other's electrical characteristics.

Figure 3:
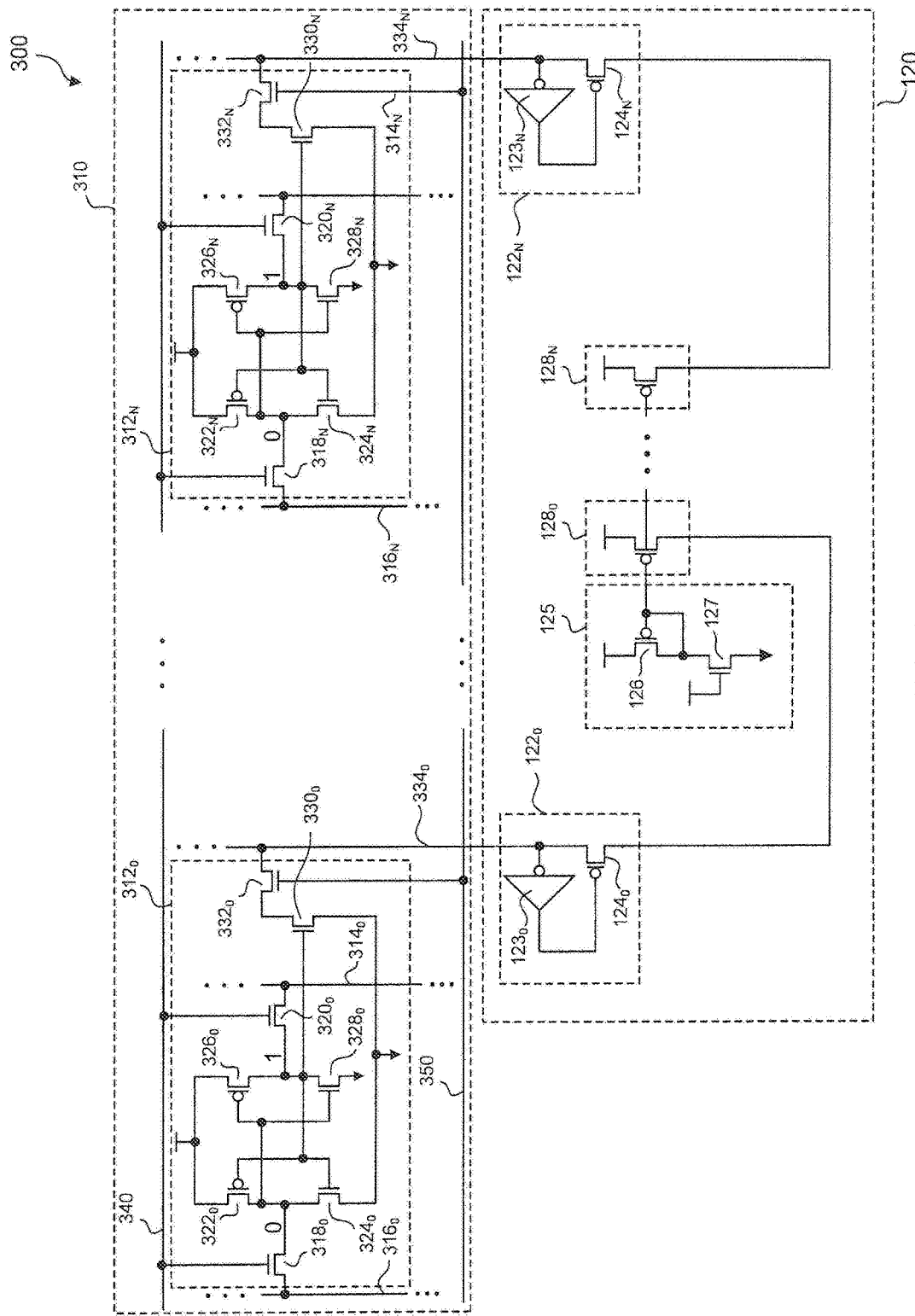
FIG. 3 depicts a multi-port SRAM device with a keeper circuit, according to embodiments of the present disclosure.

FIG. 3 depicts a multi-port SRAM device 300 with keeper circuit 120, according to embodiments of the present disclosure. SRAM device 300 includes a memory array 310 and keeper circuit 120. Keeper circuit 120 operates in the same manner as described above with respect to FIG. 1.

In FIG. 3, only one row of SRAM memory cells $312_0$-$312_N$ is shown for memory array 310 for simplicity and explanation purposes. Also, memory array 310 has 'N' columns. As would be understood by a person of ordinary skill in the art, SRAM cells $312_0$-$312_N$ in memory array 310 are arranged in rows and columns, and memory array 310 can have more than one row and more or less than 'N' columns.

In an embodiment, each of SRAM cells $312_0$-$312_N$ has an "8T" (2-port) circuit topology. Each SRAM cell 312 includes a bi-stable flip-flop structure—made up of transistors 322, 324, 326, and 328—and pass transistors 318 and 320. Pass transistors 318 and 320 are controlled by a voltage applied to a wordline 340; this voltage is provided by a wordline driver, which is not shown in FIG. 3 for simplicity. Pass transistors 318 and 320 electrically connect the SRAM's bi-stable flip structure to bitline BL 316 and to bitline BLB 314 (also referred to as "bitline 316" and "bitline 314," respectively).

Each of SRAM cells $312_0$-$312_N$ also includes an additional readout port. This additional readout port includes transistors 330 and 332. Transistor 330 is controlled by a voltage at an internal node of the SRAM cell—i.e., the voltage at an internal node between transistors 326 and 328. Transistor 332 is controlled by a read wordline 350; this voltage is provided by a read wordline driver, which is not shown in FIG. 3 for simplicity. Transistor 332 is also referred to as "readout transistor 332" or "readout port 332." Readout transistor 332 is connected to a read bitline RBL 334 (also referred to as "read bitline 334"). If an internal voltage of the SRAM's bi-stable flip-flop structure is at or near a logic high voltage—i.e., voltage at the internal node between transistors 326 and 328—then transistor 330 passes ground or 0 V to readout transistor 332. And, if a read wordline line voltage is applied to transistor 332, ground or 0V is passed to read bitline RBL 334. A person of ordinary skill in the art will recognize that other SRAM circuit topologies can be implemented with embodiments of the present disclosure.

In an embodiment, keeper circuit 120 maintains a precharge voltage—e.g., a logic high voltage—on read bitlines $334_0$-$334_N$. For example, if read bitlines $334_0$-$334_N$ are precharged to a voltage at or near a logic high voltage, keeper circuit 120 passes a keeper current—e.g., 10 µA—to the read bitlines to maintain the logic high voltage.

Keeper circuit 120 compensates for a leakage current present in SRAM cell 312. For example, with a precharged voltage at or near a logic high voltage on read bitline 334, a "leaky" path to ground exists through transistor 330 and readout transistor 332 in the SRAM's additional readout port. Leakage current from this leaky path can discharge the precharged voltage on read bitline 334. The keeper current from keeper circuit 120 is strong enough to compensate for this leakage—e.g., the keeper current is greater than the leakage current—current and maintains the voltage on read bitline 334. Conversely, the keeper current is also weak enough to discharge read bitline 334 when the bitline is supposed to discharge to a voltage at or near a logic low voltage. For example, the keeper current can be greater than the leakage current but less than a predetermined current such that the selected SRAM cell 212 can discharge bitline 214.

Keeper circuit 120 in SRAM device 300 has many advantages. In addition to the long-channel NMOS transistor 127's gate length advantage and the one bias current generator 125 for multiple bitlines advantage described above with respect to FIG. 1, keeper circuit 120 in SRAM device 300 also provides (i) improved current tracking between the SRAM cell's additional readout port and keeper circuit 120 and (ii) improved Vccmin for SRAM operations.

Because long-channel NMOS transistor 127 and NMOS readout transistor 332 in SRAM cell 312 are the same device type, an improvement in current tracking between SRAM cell 312 and keeper circuit 120 can be achieved. Specifically, bias current generator 125 in keeper circuit 120 of FIG. 3 includes long-channel NMOS transistor 127 to generate a bias current. Readout transistor 332 in SRAM cell 312 of FIG. 3 is also an n-channel MOS transistor.

Due to long-channel NMOS transistor 127 and NMOS readout transistor 332 being the same type of MOS transistor, process variations among these devices are typically similar for the devices. For example, a weak long-channel NMOS transistor 127 typically has similar device characteristics as a weak NMOS readout transistor 332—e.g., the gate widths of the NMOS transistors are fabricated shorter than a target width and/or the gate lengths of the NMOS transistors are fabricated longer than a target length. With the weak device characteristics of these transistors, the keeper circuit generates a weak bias current, which is mirrored onto the bitlines as a keeper current. At the same time, the weak NMOS readout transistor 332 provides a high resistance path to ground via transistor 330 in SRAM 312. Though the keeper circuit is "weak," the readout transistor's resistance is high such that the leakage current does not discharge the read bitline when the read bitline is supposed to be at a voltage at or near a logic high voltage.

Conversely, a strong long-channel NMOS transistor 127 typically has similar device characteristics as a strong NMOS readout transistor 332—e.g., the gate widths of the NMOS transistors are fabricated wider than a target width and/or the gate lengths of the NMOS transistors are fabricated shorter than a target length. With the strong device characteristics of these transistors, the keeper circuit generates a strong bias current, which is mirrored onto the bitlines as a keeper current. At the same time, the strong NMOS readout transistor 332 provides a low resistance path to ground via transistor 330 in SRAM 312. Though the keeper circuit is "strong," the readout transistor's resistance is low such that the leakage current discharges the read bitline when the read bitline is supposed to be at or near a logic low voltage.

By using the same type of transistor—i.e., NMOS transistor—for the long-channel device in the current bias generator and the readout transistor in the SRAM cell, the device characteristics of these transistors track one another over process variations. Also, as would be understood by a person of ordinary skill in the art, the device characteristics of the transistors also track one another across varying temperatures and supply voltages.

Keeper circuit embodiments of the present disclosure can mitigate the effects of process variations on Vccmin. For example, as discussed above, long-channel NMOS transistor 127 and NMOS readout transistor 332 typically have similar device characteristics across process variations because they are the same device type—i.e., NMOS transistors. For example, a strong long-channel NMOS transistor 127 typically has similar device characteristics as a strong NMOS readout transistor 332. With the strong device characteristics of these transistors, the keeper circuit generates a strong bias current, which is mirrored onto the bitlines as a keeper current.

At the same time, the strong NMOS readout transistor 332 provides a low resistance path to ground via transistor 330 in SRAM 312. Though the keeper circuit is "strong," the readout transistor's resistance is low such that the read bitline discharges when the read bitline is supposed to be at or near a logic low voltage. As a result, for a sensing operation on the read bitline, the SRAM cell's Vccmin is minimized because the read bitline voltage is at or near the intended logic low voltage due to the strong NMOS readout transistor 332.

Figure 4:
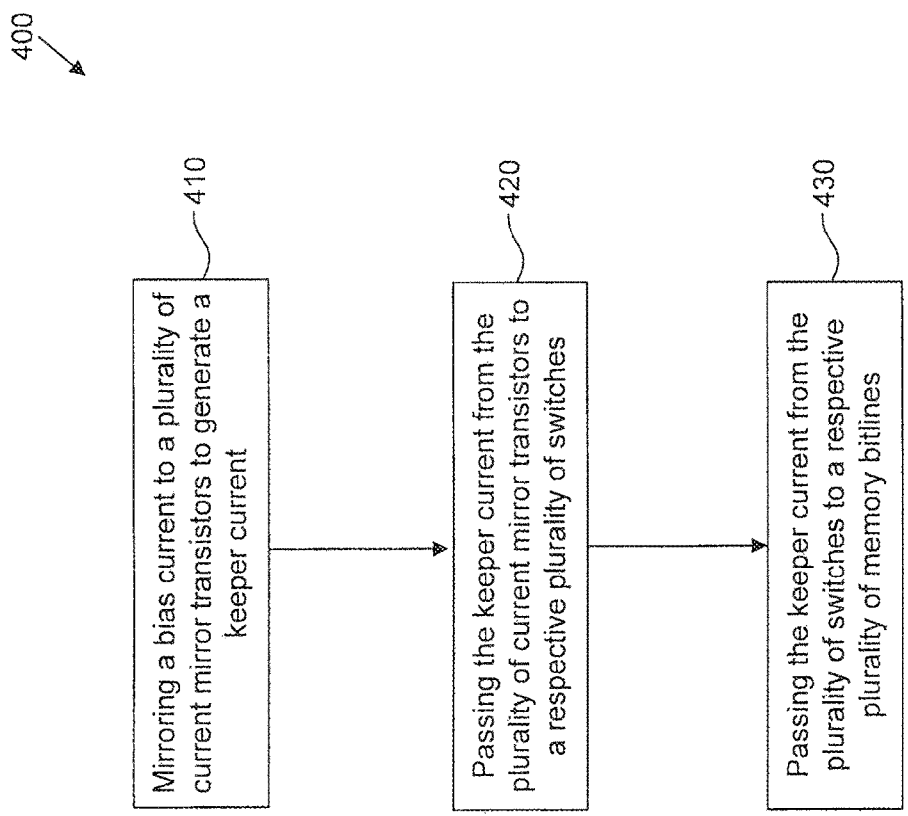
FIG. 4 depicts a method for maintaining a voltage potential on memory bitlines, according to embodiments of the present disclosure.

FIG. 4 depicts a method 400 for maintaining a voltage on memory bitlines, according to embodiments of the present disclosure. In an embodiment, each of SRAM devices 200 and 300 in FIGS. 2 and 3, respectively, can perform the operations of method 400.

In operation 410, a bias current is mirrored to a plurality of current mirror transistors to generate a keeper current. In an embodiment, the bias current is generated using a long-channel, n-type metal-oxide-semiconductor field-effect transistor connected to a diode-connected, p-channel metal-oxide-semiconductor field-effect transistor—e.g., long-channel NMOS transistor 127 and PMOS transistor 126 in bias current generator 125 of FIGS. 1-3. The keeper circuit is based on a ratio of a size of the diode-connected, p-channel metal-oxide-semiconductor field-effect transistor to a size of each of the plurality of current mirror transistors, according to an embodiment.

In operation 420, the keeper current is passed from the plurality of current mirror transistors to a respective plurality of switches. In an embodiment, when passing the keeper current, one or more device characteristics of a readout port for memory cells are tracked.

In operation 430, the keeper current is passed from the plurality of switches to a respective plurality of memory bitlines when the plurality of bitlines is within a certain voltage range. In an embodiment, the certain voltage range is a voltage range including a logic high voltage—e.g., a power supply voltage of 1.2 V, 1.8 V, 2.4 V, 3.3 V, or 5 V.

Based on the above description, embodiments of the present disclosure can be described as a memory device, a keeper circuit, and a method.

An embodiment of the memory device includes a memory array and a keeper circuit. The memory array includes a plurality of bitlines coupled to memory cells. The keeper circuit includes a plurality of switches and a current mirror circuit. The plurality of switches is respectively coupled to the plurality of bitlines. The current mirror circuit is configured to mirror a bias current to a plurality of current mirror transistors respectively coupled to the plurality of switches.

An embodiment of the keeper circuit includes a plurality of switches and a current mirror circuit. The plurality of switches includes an inverter and a pass transistor. The current mirror circuit is configured to mirror a bias current to a plurality of current mirror transistors respectively coupled to the plurality of switches.

An embodiment of the method includes three operations. First, a bias voltage is applied to a plurality of current mirror transistors to generate a keeper current that is mirrored from the bias generator. Second, the keeper current is passed from the plurality of current mirror transistors to a respective plurality of switches. Third, the keeper current is passed from the plurality of switches to a respective plurality of memory bitlines.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array comprising a plurality of bitlines coupled to a plurality of memory cells; and
   a keeper circuit comprising:
      a bias current generator configured to generate a bias current; and
      a switch, coupled to a bitline of the plurality of bilines, configured to:
         couple the bitline to the bias current generator to pass a keeper current to the bitline when the bitline is at a first logical level, the keeper current being based on the bias current, and
         decouple the bitline from the bias current generator to prevent the keeper current from being passed to the bitline when the bitline is at a second logical level.

2. The memory device of claim 1, wherein the switch is directly coupled to the bitline.

3. The memory device of claim 1, wherein the bias current generator comprises:
   a p-channel metal-oxide-semiconductor field-effect (PMOS) transistor; and
   a diode-connected PMOS transistor,
   wherein the PMOS transistor and the diode-connected PMOS transistor are configured and arranged to generate the bias current from a power supply voltage.

4. The memory device of claim 1, further comprising:
   a current mirror transistor configured to mirror the bias current to provide the keeper current, wherein the switch is further configured to electrically connect the current mirror transistor to the bitline to pass the keeper current to the bitline when the bitline is at the first logical level, and
   wherein the switch is further configured to not electrically connect the current mirror transistor to the bitline to prevent the keeper current from being passed to the bitline when the bitline is at the second logical level.

5. The memory device of claim 4, wherein the keeper current is configured to charge the bitline to a voltage at or near a logic high voltage.

6. The memory device of claim 1, wherein the switch comprises:
   an inverter having an input coupled to the bitline; and a pass device, coupled to an output of the inverter, configured to:
  pass the keeper current to the bitline when the bitline is at the first logical level, and
  not pass the keeper current to the bitline when the bitline is at the second logical level.

7. The memory device of claim 6, wherein the pass device comprises:
  a p-channel metal-oxide-semiconductor field-effect (PMOS) transistor.

8. The memory device of claim 4, wherein the bias current generator comprises:
  a diode-connected p-channel metal-oxide-semiconductor field-effect (PMOS) transistor,
  wherein a gate width of the current mirror transistor is sized equal to or smaller than a gate width of the diode-connected PMOS transistor.

9. The memory device of claim 1, wherein the keeper circuit further comprises:
  a second switch, coupled to a second bitline of the plurality of bitlines, configured to:
    couple the second bitline to the bias current generator to pass a second keeper current to the second bitline when the second bitline is at the first logical level, the second keeper current being based on the bias current, and
    decouple the second bitline from the bias current generator to prevent the second keeper current from being passed to the second bitline when the second bitline is at the second logical level.

10. The memory device of claim 9, further comprising:
  a current mirror transistor configured to mirror the bias current to provide the keeper current,
  wherein the switch is further configured to electrically connect the current mirror transistor to the bitline to pass the keeper current to the bitline when the bitline is at the first logical level, and
  wherein the switch is further configured to not electrically connect the current mirror transistor to the bitline to prevent the keeper current from being passed to the bitline when the bitline is at the second logical level; and
  a second current mirror transistor configured to mirror the bias current to provide the second keeper current,
  wherein the second switch is further configured to electrically connect the second current mirror transistor to the second bitline to pass the second keeper current to the second bitline when the second bitline is at the first logical level, and
  wherein the second switch is further configured to not electrically connect the second current mirror transistor to the second bitline to prevent the second keeper current from being passed to the second bitline when the second bitline is at the second logical level.

11. A memory device, comprising:
  a memory array comprising a plurality of bitlines coupled to a plurality of memory cells; and
  a keeper circuit comprising:
    a switch coupled to a bitline of the plurality of bitlines;
    means for generating a bias current;
    means for mirroring the bias current to generate a keeper current; and
    means for passing the keeper current to the switch,
    wherein the switch is configured to:
      couple the bitline to the means for passing when the bitline is at a first logical level; and
      decouple the bitline from the means for passing when the bitline is at a second logical level.

12. The memory device of claim 11, wherein the keeper current is configured to charge the bitline to a voltage at or near a logic high voltage.

13. The memory device of claim 11, wherein the switch comprises:
  an inverter having an input coupled to the bitline; and
  a pass device, coupled to an output of the inverter, configured to:
    pass the keeper current to the bitline when the bitline is at the first logical level, and
    not pass the keeper current to the bitline when the bitline is at the second logical level.

14. The memory device of claim 13, wherein the pass device comprises:
  a p-channel metal-oxide-semiconductor field-effect (PMOS) transistor.

15. The memory device of claim 11, wherein the keeper circuit further comprises:
  a second switch, coupled to a second bitline of the plurality of bitlines, configured to:
    couple the second bitline to the means for generating when the second bitline is at the first logical level, and
    decouple the second bitline from the means for generating when the second bitline is at the second logical level.

16. The memory device of claim 15, wherein the keeper circuit further comprises:
  second means for passing the keeper current to the second switch,
  wherein the second switch is configured to:
    couple the second bitline to the second means for passing when the second bitline is at the first logical level; and
    decouple the second bitline from the second means for passing when the second bitline is at the second logical level.

17. A method, comprising:
  generating a bias current;
  mirroring the bias current to generate a keeper current;
  passing the keeper current to a bitline of a plurality of bitlines when the bitline is at a first logical level; and
  not passing the keeper current to the bitline when the bitline is at a second logical level.

18. The method of claim 17, wherein the passing comprises:
  activating a switch to pass the keeper current to the bitline.

19. The method of claim 17, wherein the not passing comprises:
  deactivating a switch to prevent the keeper current from being passed to the bitline.

20. The method of claim 17, further comprising:
  mirroring the bias current to generate a second keeper current;
  passing the second keeper current to a second bitline of the plurality of bitlines when the second bitline is at the first logical level; and
  not passing the second keeper current to the second bitline when the second bitline is at the second logical level.

21. The method of claim 17, wherein the passing comprises:

passing the keeper current to generate a logic high voltage at the bitline.

* * * * *